(12) United States Patent
Khlat et al.

(10) Patent No.: US 9,263,991 B2
(45) Date of Patent: Feb. 16, 2016

(54) POWER MANAGEMENT/POWER AMPLIFIER OPERATION UNDER DYNAMIC BATTERY DROPS

(71) Applicant: RF Micro Devices, Inc., Greensboro, NC (US)

(72) Inventors: Nadim Khlat, Cugnaux (FR); Jean-Blaise Pierres, Pibrac (FR); Michael R Kay, Summerfield, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 42 days.

(21) Appl. No.: 14/209,581

(22) Filed: Mar. 13, 2014

(65) Prior Publication Data

US 2014/0266429 A1  Sep. 18, 2014

Related U.S. Application Data

(60) Provisional application No. 61/779,946, filed on Mar. 13, 2013.

(51) Int. Cl.
*H03F 1/02* (2006.01)

(52) U.S. Cl.
CPC ............... *H03F 1/02* (2013.01); *H03F 1/0211* (2013.01); *H03F 1/0261* (2013.01); *H03F 2203/45192* (2013.01)

(58) Field of Classification Search
CPC .................................................. H03F 1/0211
USPC ................................. 330/127, 285, 296, 297
See application file for complete search history.

(56) References Cited

U.S. PATENT DOCUMENTS

| | | | | |
|---|---|---|---|---|
| 5,168,206 A | * | 12/1992 | Jones | 320/163 |
| 5,611,318 A | * | 3/1997 | Kesler | 123/630 |
| 7,750,604 B2 | * | 7/2010 | Hartular et al. | 320/139 |
| 7,999,516 B2 | * | 8/2011 | Hartular et al. | 320/139 |
| 2003/0107440 A1 | * | 6/2003 | Miki et al. | 330/297 |

* cited by examiner

*Primary Examiner* — Henry Choe
(74) *Attorney, Agent, or Firm* — Withrow & Terranova, P.L.L.C.

(57) ABSTRACT

In one embodiment, a digital internal amplified voltage of power management circuitry is forced to an input threshold voltage upon a determination that a set of emergency conditions is satisfied, and is set to an input minimum battery voltage upon a determination that the set of emergency conditions is not satisfied. The emergency conditions may include determining that a battery voltage is less than a threshold voltage and determining that an input minimum battery voltage is less than an input threshold voltage.

17 Claims, 9 Drawing Sheets

POWER MANAGEMENT/POWER AMPLIFIER OPERATION UNDER DYNAMIC BATTERY DROPS

RELATED APPLICATIONS

This application claims the benefit of provisional patent application Ser. No. 61/779,946, filed Mar. 13, 2013 in its entirety.

FIELD OF THE DISCLOSURE

The disclosure relates to communication circuitry, specifically to using a boost/buck circuit to provide a bias supply voltage for biasing power amplifiers when a battery voltage drops below a threshold voltage.

BACKGROUND

In communication circuitry such as smartphones and tablets, powerful application processors are capable of providing high MIPS (Millions of Instructions Per Second) and utilizing high-frequency clocks.

Modern processors are relatively efficient and can operate at high MIPS/milliamp. However, operating at high MIPS results in large currents being drawn from a battery. For example, some games require operation at high MIPS. Other applications may also result in large currents, such as a vibrating alarm being triggered, or operating in a video mode.

These large currents result in a significant voltage drop of the battery voltage, due to the ESR (equivalent series resistance) of the battery and the battery connector. Battery voltage drops on the order of 1 volt may occur over very quickly, perhaps in one second or less. For example, a battery voltage may drop from 3.5 volts down to 2.5 volts. These battery voltage fluctuations are dynamic.

The battery voltage is conventionally used by bias circuitry to generate bias voltages for the power amplifiers. However, conventional bias circuitry requires a minimum bias supply voltage such as 3.2 volts to properly generate bias voltages. As a specific example, bias control circuitry located inside a CMOS (Complementary Metal Oxide Semiconductor) controller in a multimode multiband power amplifier requires a supply voltage of at least 3.2 volts in order to operate with enough headroom to provide proper bias voltage for power amplifiers.

Thus, if the battery voltage drops from 3.5 volts down to 2.5 volts (below 3.2 volts), then conventional bias circuitry may not operate properly, and the power amplifiers may not operate properly. This is a large problem.

SUMMARY

In this disclosure, various embodiments are described for providing at least a threshold voltage to the bias circuitry when the battery voltage drops below a threshold voltage.

Conventionally, boost/buck circuitry provides an amplified battery voltage for driving supplemental power supplies for power amplifiers. Using envelope tracking (ET) or average power tracking (APT) or other similar procedures, the amplified battery voltage is intentionally reduced during periods of low signal power, thus reducing power consumption.

If a set of emergency conditions is satisfied, then emergency is declared and the boost/buck circuitry located in power management circuitry may be "drafted" (or "reused" or "forced") into supplying at least a threshold voltage for bias circuitry, instead of conventionally using envelope tracking (ET) or average power tracking (APT) procedures to provide low voltages during periods of low signal power (in a peacetime mode).

In an emergency, the boost/buck circuitry no longer performs its normal peacetime duties of intentionally reducing power consumption for ET and APT, but instead operates in an emergency mode to protect proper operation of bias circuitry by providing at least a threshold voltage to the bias circuitry. In this fashion, at least a threshold voltage is provided to the bias circuitry during the emergency without requiring additional boost/buck circuitry. Slightly increased power consumption (due to lack of ET or APT) is a small price to pay for protecting proper operation of the bias circuitry during the emergency, in comparison to the cost of an additional boost/buck circuit.

Additionally, bias circuitry may be modified to select the amplified battery voltage instead of the battery voltage under appropriate circumstances. For example, the bias circuitry may select the higher of the battery voltage or the amplified battery voltage to serve as a bias supply voltage.

In one embodiment, communications circuitry includes a first determining circuitry configured to determine whether a first condition is satisfied, wherein the first condition is that a battery voltage is less than a threshold voltage, and a second determining circuitry configured to determine whether a second condition is satisfied, wherein the second condition is that an input minimum battery voltage is less than an input threshold voltage.

In one embodiment, communication circuitry includes logic circuitry configured to force a digital internal amplified voltage to an input threshold voltage upon a determination that a set of emergency conditions is satisfied and configured to set the digital internal amplified voltage to an input minimum battery voltage upon a determination that the set of emergency conditions is not satisfied. The communication circuitry further includes a digital/analog converter configured to convert the digital internal amplified voltage to a minimum amplified battery voltage.

Those skilled in the art will appreciate the scope of the present disclosure and realize additional aspects thereof after reading the following detailed description of the preferred embodiments in association with the accompanying drawing figures.

BRIEF DESCRIPTION OF THE FIGURES

The accompanying figures incorporated in and forming a part of this specification illustrate several aspects of the disclosure, and together with the description serve to explain the principles of the disclosure. Each of the following figures is an illustrative and non-limiting embodiment of at least a portion of the disclosed invention.

DETAILED DESCRIPTION

The embodiments set forth below represent the necessary information to enable those skilled in the art to practice the embodiments and illustrate the best mode of practicing the embodiments. Upon reading the following description in light of the accompanying figures, those skilled in the art will understand the concepts of the disclosure and will recognize applications of these concepts not particularly addressed herein. It should be understood that these concepts and applications fall within the scope of the disclosure and the accompanying claims.

Figure 1:
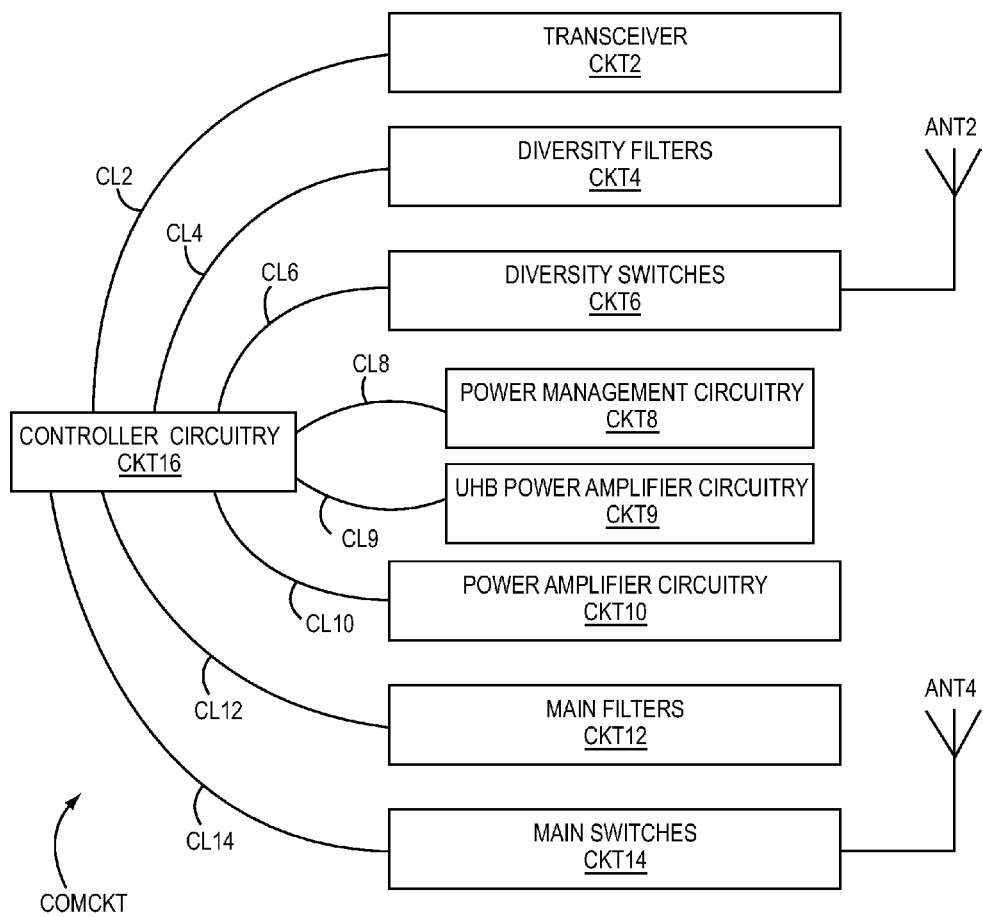
FIG. 1 illustrates communication circuitry including major components, according to one embodiment of the invention.

FIG. 1 illustrates communication circuitry COMCKT including major components, according to one embodiment of the present disclosure. The major components include transceiver CKT2, diversity filters CKT4, diversity switches CKT6, power management circuitry CKT8, UHB power amplifier circuitry CKT9, power amplifier circuitry CKT10, main filters CKT12, main switches CKT 14, controller circuitry CKT16, diversity antenna ANT2, and main antenna ANT4.

Controller circuitry CKT16 communicates with: transceiver CKT2 through control lines CL2; diversity filters CKT4 through control lines CL4; diversity switches CKT6 through control lines CL6; power management circuitry CKT8 through control lines CL8; UHB power amplifier circuitry CKT9 through control lines CL9; multimode, multiband (MMMB) power amplifier circuitry CKT10 through control lines CL10; main filters CKT12 through control lines CL12; and main switches CKT 14 through control lines CL14. Diversity antenna ANT2 communicates with diversity switches CKT6, and main antenna ANT4 communicates with main switches CKT14.

Figure 2:
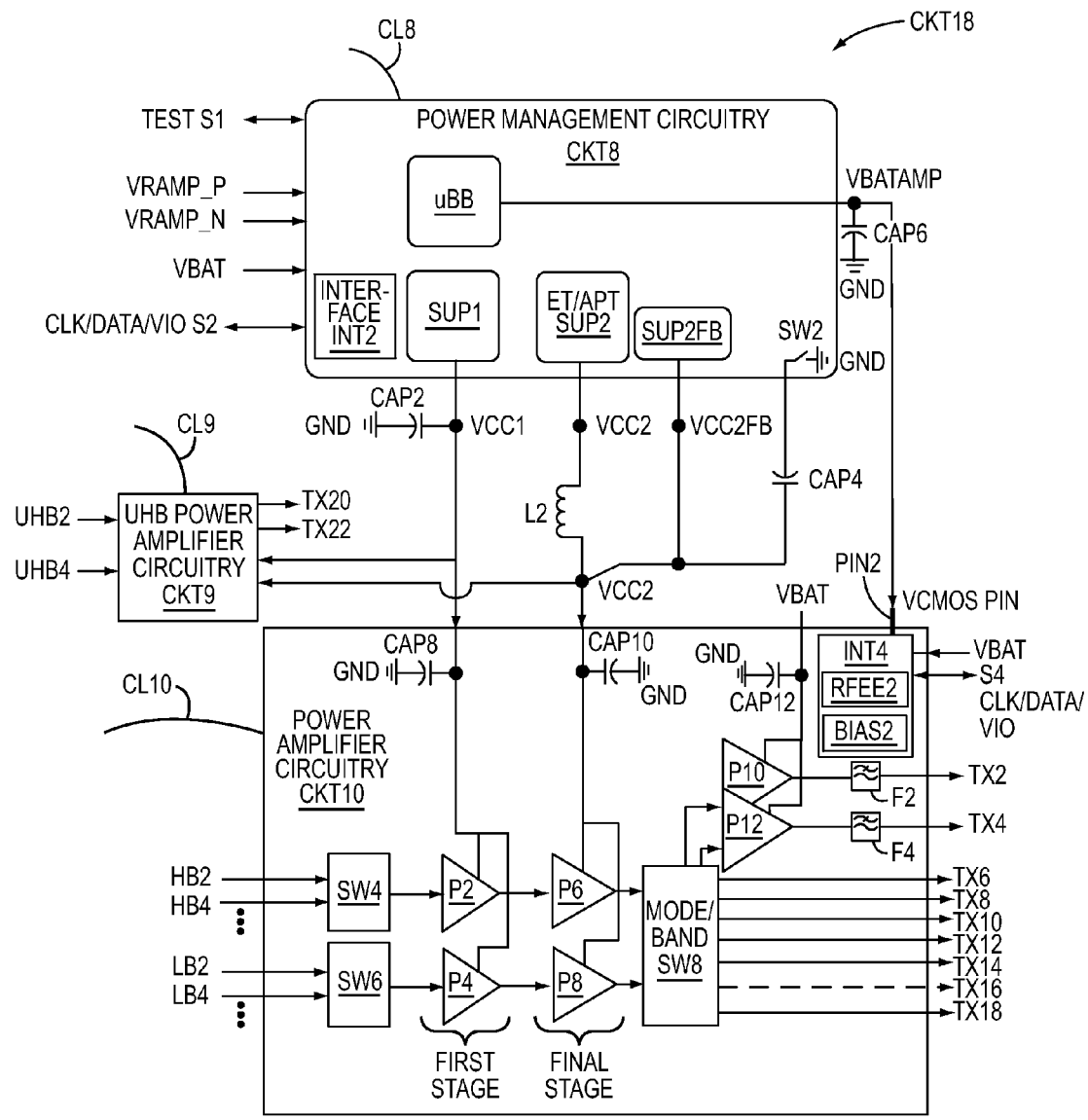
FIG. 2 illustrates three major components of the communications circuitry: power management circuitry, UHB power amplifier circuitry, and multimode multiband (MMMB) power amplifier circuitry.

FIG. 2 illustrates an overview of three major components of the communications circuitry COMCKT: power management circuitry CKT8; ultrahigh band (UHB) power amplifier circuitry CKT9, and power amplifier circuitry CKT10. Additional details of these components are provided in later figures, especially boost/buck circuitry uBB in FIGS. 3, 4, and 5 (with greater detail).

Power management circuitry CKT8 includes boost/buck circuitry uBB, management interface INT2, first supply voltage circuit SUP1, second supply voltage circuit SUP2, and third supply voltage circuit SUP2FB, and switch SW2.

Power management circuitry CKT8 receives control lines CL8, test signals S1, differential signals Vramp_p and Vramp_n, battery voltage Vbat, management interface signals S2 (including a clock signal, serial data signals, and a dedicated voltage), and may ground the second supply voltage VCC2 through switch SW2.

Power management circuitry CKT8 generates first supply voltage VCC1, second supply voltage VCC2, third supply voltage VCC2FB, and amplified battery voltage Vbatamp. Additional detail for power management circuitry CKT8 is provided below in FIGS. 3, 4, and 5.

UHB power amplifier circuitry CKT9 receives control lines CL9, first supply voltage VCC1, second supply voltage VCC2, first UHB signal UHB2, and second UHB signal UHB4. Additionally, UHB power amplifier circuitry CKT9 generates amplified signal TX20 and amplified signal TX22. Additional detail for UHB power amplifier circuitry CKT9 is provided in FIG. 7.

Power amplifier circuitry CKT10 is a multimode multiband (MMMB) power amplifier circuit, and includes: switches SW4, SW6, and SW8; capacitors CAP8, CAP10, and CAP12; power amplifiers P2, P4, P6, P8, P10, and P12; filters F2 and F4, and power interface INT4.

Power amplifier circuitry CKT10 receives control lines CL10, first supply voltage VCC1, second supply voltage VCC2, third supply voltage VCC2FB, battery voltage Vbat, amplified battery voltage Vbatamp, first high band signal HB2, second high band signal HB4, first low band signal LB2, second low band signal LB4, and power interface signals S4 (including a clock signal, serial data signals, and a dedicated voltage).

Power amplifier circuitry CKT10 generates transmission signals TX2, TX4, TX6, TX8, TX10, TX12, TX14, TX16, TX18, and may send second interface signals S4.

In power amplifier circuit CKT10, first supply voltage VCC1 is grounded through capacitor CAPE, and supplies power to first stage power amplifiers P2 and P4. Second supply voltage VCC2 is grounded through capacitor CAP10 supplies power to final stage power amplifiers P6 and P8. Battery voltage Vbat is grounded through capacitor CAP12 and supplies power to power amplifiers P10 and P12.

Switch SW4 receives first high band signal HB2 and second high band signal HB4, and selects one of these signals. The selected high band signal is amplified by power amplifier P2, then by power amplifier P6, and then sent to mode/band switch SW8.

Similarly, switch SW6 receives first low band signal LB2 and second low band signal LB4, and then selects one of these signals. The selected low band signal is amplified by power amplifier P4, then by power amplifier P8, and then sent to mode/band switch SW8.

Mode/Band switch SW8 receives the amplified selected high band signal and the amplified selected low band signal, chooses one of these received signals, and sends the chosen signal to at least one of: power amplifier P10, power amplifier P12, signal line TX6, signal line TX8, signal line TX10, signal line TX12, signal line TX14, signal line TX16, or signal line TX18.

Power amplifier P10 receives the chosen signal, amplifies it, and sends it to filter F2. Filter F2 filters the amplified chosen signal and sends it to signal line TX2. Power amplifier P12 receives the chosen signal, amplifies it, and sends it to filter F4. Filter F4 filters the amplified chosen signal and sends it to signal line TX4.

Power interface INT4 receives amplified battery voltage Vbatamp through pin PIN2 (also known as the VCMOS pin), receives battery voltage Vbat, and receives power interface signals S4 (including a clock signal, serial data signals, and a dedicated voltage). Additional details are provided in FIG. 6.

Figure 3:
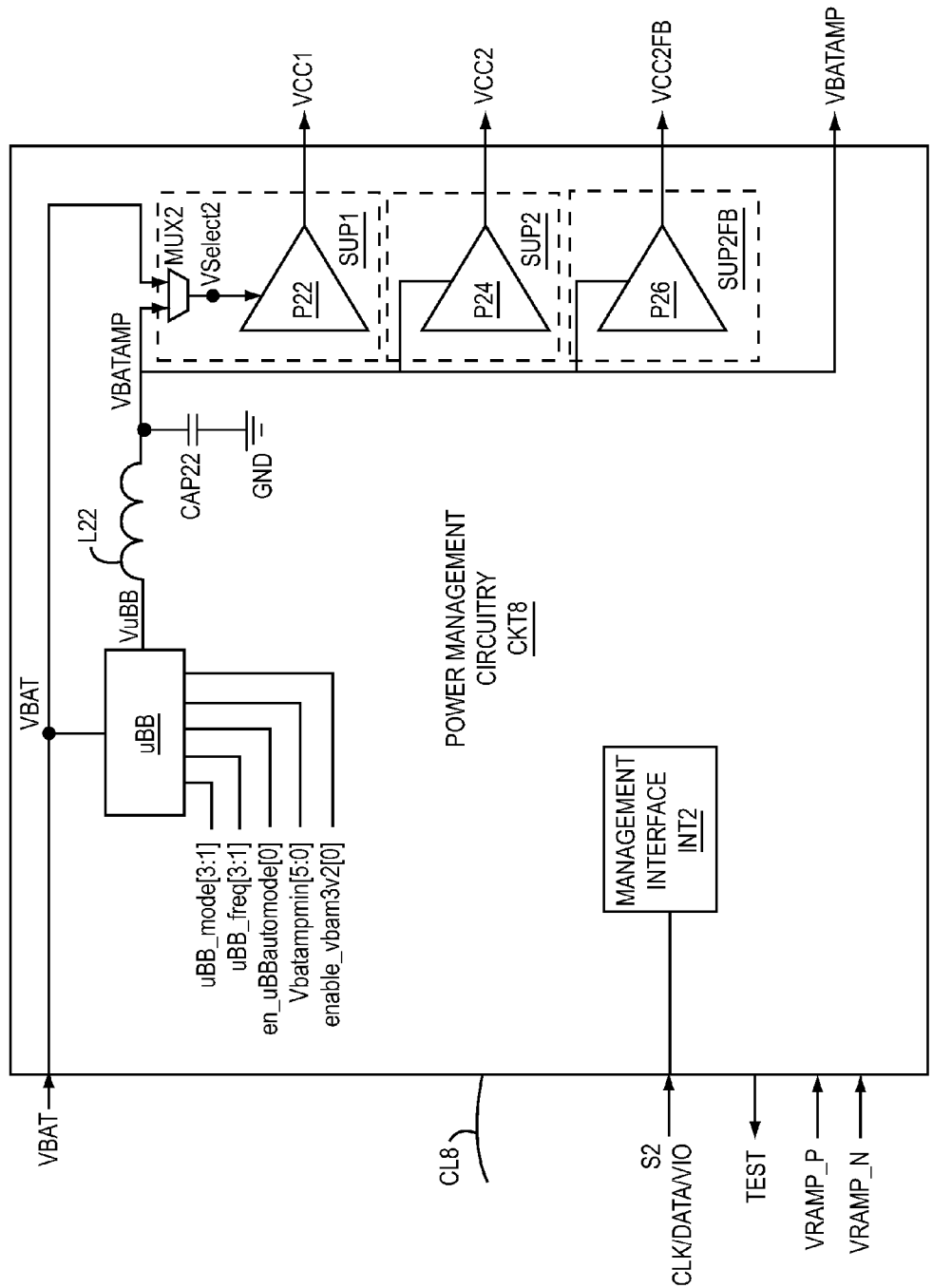
FIG. 3 illustrates the power management circuitry including a boost/buck circuit, a first interface, a first supplemental power supply, a second supplemental power supply, and a third supplemental power supply.
Figure 4:
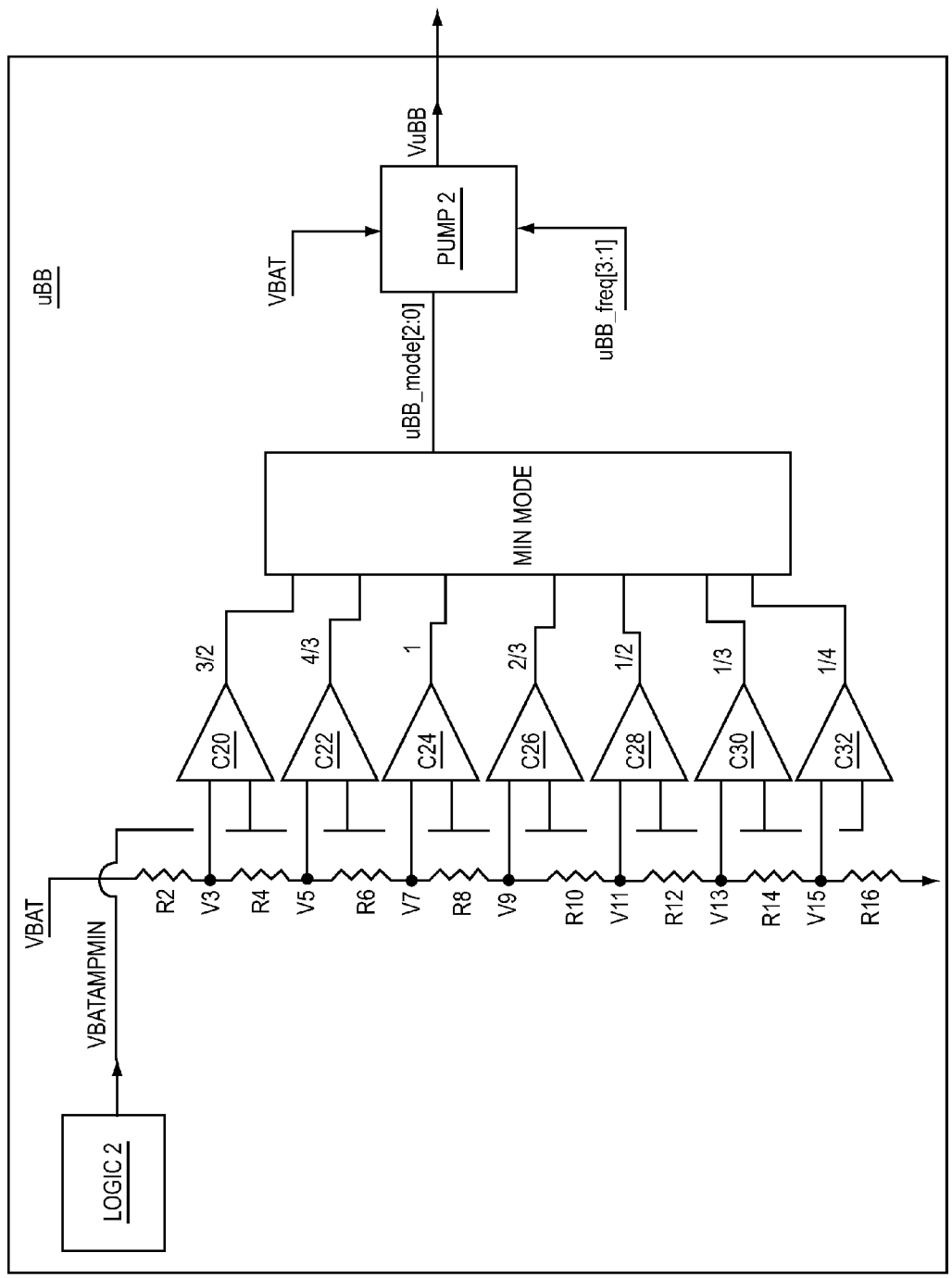
FIG. 4 illustrates boost/buck circuitry including logic circuitry, minimum mode circuitry, and a charge pump.
Figure 5:
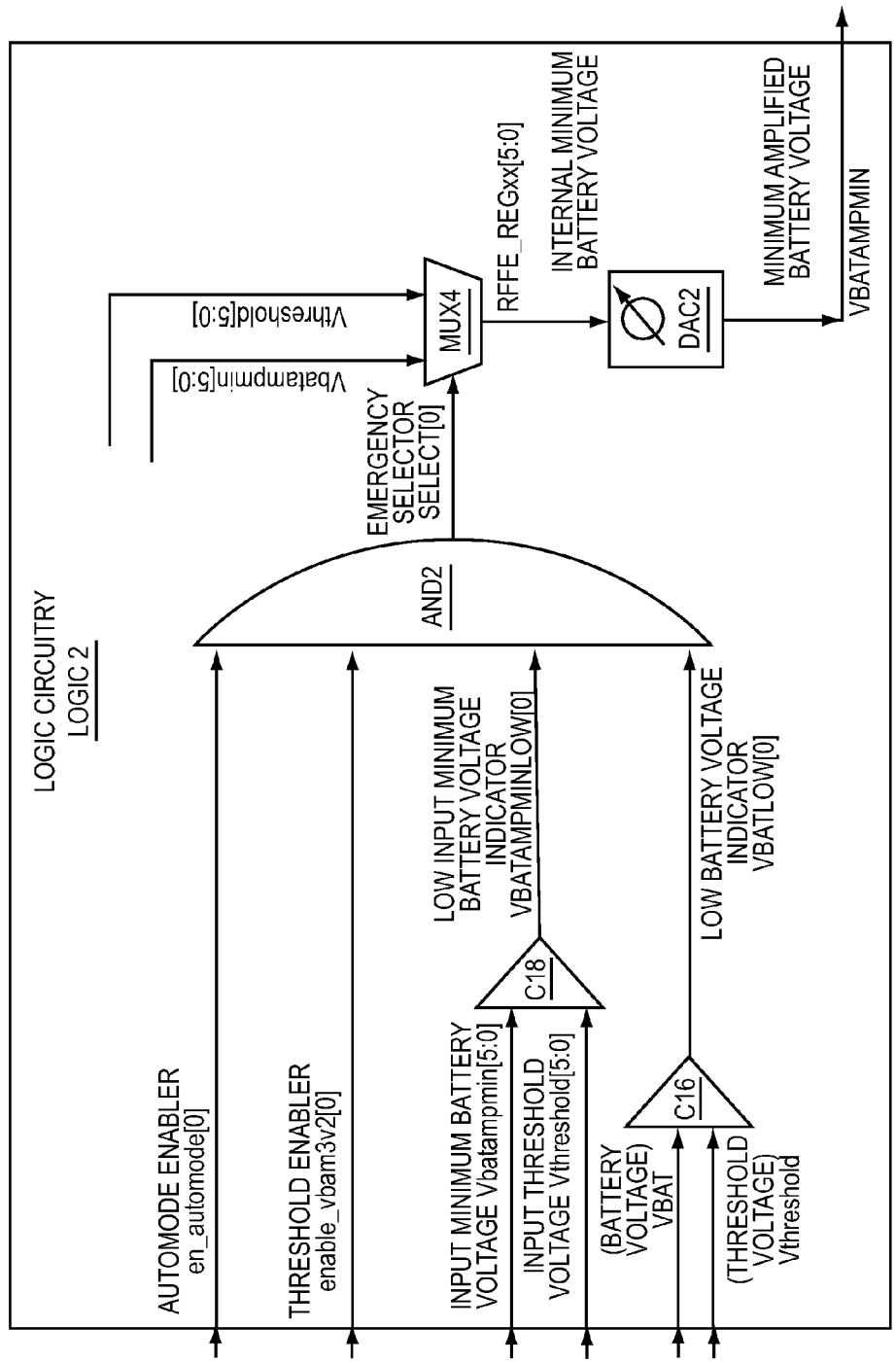
FIG. 5 illustrates logic circuitry from the boost/buck circuitry.

FIG. 3 illustrates power management circuitry CKT8 including components boost/buck circuitry uBB, first management interface INT2, first supplemental power supply SUB 1, second supplemental power supply SUP2, and a third supplemental power supply SUP3. The inputs and outputs of power management circuitry CKT8 were discussed above in FIG. 2. FIG. 3 provides additional detail regarding boost/buck circuitry uBB and the supplemental power supplies. FIG. 4 provides detail for the boost/buck circuitry uBB, and briefly mentions logic circuitry LOGIC2. FIG. 5 provides detail for logic circuitry LOGIC2, and clearly illustrates one set of emergency conditions.

Boost/buck circuitry uBB has a feature referred to as uBB automode that will automatically determine an internal boost/buck ratio (or uBB mode, or uBB ratio) based on input minimum battery voltage vbatampmin[5:0] (also known as target programmable voltage) and battery voltage Vbatt. This uBB automode is enabled by automode enabler en_ubbautomode[0] in register 0. Automode may be enabled during 2.5G mode operation of the communication circuitry to allow operation under low battery voltage conditions.

This automode avoids the needs to calculate internal ratios based on battery voltage changes. Further, there is not enough time for transceiver CKT2 (a radio frequency integrated circuit) to perform these calculations when the battery drop pulses occur suddenly. Transceiver CKT2 conventionally has two processors, in addition to various transmitters and receivers. The transceiver conventionally generates about +2 dBm of power as a transmitter, and signals from the transceiver are amplified by power amplifier circuitry CKT10.

Under non-automode conditions, transceiver CKT2 calculates the target programmable Vbatampmin[5:0] as follows:

$$Vbatampmin[5:0]=0.816V+0.052*Vbatampmin[d]$$

Wherein Vbatampmin[d] is a six bit digital word that takes a value from 0 to 63d (decimal) and is programmed into transceiver CKT2.

As a first example of a low power APT mode, if Vbatampmin[5:0] is programmed to a digital value equivalent to 0.816V, and Vbat=3.6V, then in automode the boost/buck circuitry uBB will select ubb_mode[2:0] corresponding to ¼ mode such that VuBB and Vbatamp equal 0.90 volts. Specifically, the ¼ mode is selected because ¼ of Vbat equals 0.90 volts, and 0.90 volts is at least equal to the Vbatampmin[5:0] value of 0.816V. This is the lowest uBB mode that will generate a VuBB at least equal to Vbatampmin[5:0].

However, if the battery voltage Vbat drops to 2.5V and all emergency conditions are satisfied, then digital internal minimum battery voltage RFFE_REGxx[5:0] will be forced to a threshold voltage such as 3.2V. This threshold voltage may be a predetermined value (and may be hardwired), or may be a variable input such as input threshold voltage Vthreshold[5:0]. Then pump PUMP2 will automatically switch to a substantially higher mode such as 4/3 mode, because VuBB=4/3*Vbat=3.33V, and 3.33V is equal to or greater than threshold voltage 3.2 v. Thus, the 4/3 mode is the minimum mode that will generate VuBB (and Vbatamp) at least equal to the threshold voltage. The detailed logic for this example is provided below in FIG. 5. Also, four exemplary conditions required to declare an emergency are illustrated and described in FIG. 5.

The internal boost/buck ratio is approximately equal to the Vbatamp/Vbat ratio, as will become clear in FIG. 4.

Boost/buck circuitry uBB receives five digital inputs (from top to bottom): input mode selector uBB_mode[3:1], input frequency selector uBB_freq[3:1], automode enabler en_uBBautomode[0], input minimum battery voltage Vbatampmin[5:0], and threshold enabler enable_vbam3v2[0]. Throughout this specification, digital signals are generally indicted by brackets that indicate bits. For example, input mode selector uBB_mode[3:1] is a digital three bit signal intended for bits 3 and 2 and 1 in a register. More or fewer bits may be used, and different bits of the register may be used. Detailed discussion of these digital inputs is provided in FIGS. 4 and 5. These digital inputs may be received by management interface INT2, and then sent to boost/buck circuitry uBB for action. Control lines CL8 may carry these digital inputs.

Based at least in part upon these five digital inputs and upon battery voltage Vbat, boost/buck circuitry uBB generates boost/buck voltage VuBB. Boost/buck voltage VuBB is filtered by inductor L22 and capacitor CAP22 to generate amplified battery voltage Vbatamp. Although the name "amplified battery voltage" is used, under some conditions Vbatamp may actually be a bucked battery voltage, and thus less than the battery voltage.

Under non-emergency conditions, boost/buck circuitry uBB operates in a uBB mode selected to generate boost/buck voltage VuBB (and Vbatamp) greater than or equal to the input minimum battery voltage Vbatampmin[5:0] (also known as target programmable voltage). This uBB mode may be externally calculated in transceiver circuitry CKT2 and provided as input mode selector uBB_mode[3:1], or may be generated internally as illustrated in FIG. 4. The input minimum battery voltage Vbatampmin[5:0] may use ET or APT to conserve power while providing headroom for the supplemental power supplies SUP1, SUP2, and SUP2FB.

Under emergency conditions, amplified battery voltage Vbatamp may be driven relatively high (higher than target programmable voltage Vbatampmin[5:0]) and then sent to bias control BIAS2 of power amplifier circuitry CKT10, and then used to generate bias voltages for power amplifiers such as P2 and P4.

Specifically, first supplemental power supply SUP1 includes first multiplexer MUX2 that selects between amplified battery voltage Vbatamp and battery voltage Vbat. The higher voltage is selected and sent as supply voltage VSelect2 to amplifier P22. Amplifier P22 generates first supply voltage VCC1 for first stage power amplifiers P2 and P4.

Second supplemental power supply SUP2 may include a multiplexer similar to MUX2 (not shown), and second supplemental power supply SUP2 generates second supply voltage VCC2 for final stage power amplifiers P6 and P8. Second supply voltage VCC2 may be filtered by inductor L2 (see FIG. 2). To conserve power, second supply voltage VCC2 may be controlled for envelope tracking (ET) or average power tracking (APT) such that the second supply voltage is low when the signals processed by final stage amplifiers P6 and P8 are low.

Third supplemental power supply SUP2FB may include a multiplexer similar to MUX2 (not shown). Third supplemental power supply SUP2FB generates third supply voltage VCC2FB under certain low power conditions when the second power supply SUP2 is turned off. In this case, VCC2FB will be the supply voltage to final stage power amplifiers P6 and P8. Generally, not more than one of second supplemental power supply SUP2 and third supplemental power supply SUP2FB will be on at any single time.

FIG. 4 illustrates logic circuitry LOGIC2, minimum mode circuitry CKT24, and charge pump PUMP2. Logic circuitry LOGIC2 is described in detail in FIG. 5.

Logic circuitry LOGIC2 outputs a minimum amplified battery voltage Vbatampmim (an analog voltage). A set of resistors (R2, R4, R6, R8, R10, R12, R14, and R16) is used to "voltage divide" battery voltage Vbat into stepped down voltages (V3, V5, V7, V9, V11, V13, and V15) that are all less than Vbat. The stepped down voltages are compared to Vbat using transistors C20, C22, C24, C26, C28, C30, and C32, and then the comparisons are used by minimum mode circuit CKT24 to determine an internal minimum mode uBB_mode[2:0] that will cause pump PUMP2 to generate a boost/buck voltage VuBB at least equal to minimum battery amplified voltage Vbatampmin.

Internal minimum mode uBB_mode[2:0] is received by pump PUMP2, and pump PUMP2 operates at a ratio (or mode) that generates a boost/buck voltage VuBB at least equal to Vbatampmin.

Pump PUMP2 also receives input frequency selector uBB_freq[3:1] and battery voltage Vbat, and then generates boost/buck voltage VuBB. As discussed in FIG. 3, boost/buck voltage VuBB is filtered to generate amplified battery voltage Vbatamp.

Alternatively, pump PUMP2 may receive an internal frequency selector (not shown) other than input frequency selector uBB_freq[3:1].

FIG. 5 illustrates logic circuitry LOGIC2 in boost/buck circuitry uBB.

In one embodiment, four conditions must be satisfied to create an emergency condition, as illustrated by the four inputs of AND gate AND2. These four inputs (or conditions) are discussed from bottom to top.

First condition, determine that battery voltage Vbat is less than threshold voltage Vthreshold, and then set low battery voltage indicator Vbatlow[0] to 1 (enabled). This indicates the most important condition for needing an emergency mode: the battery voltage is below the threshold voltage necessary for proper operation of bias circuitry BIAS2. If this first condition is met, then problems probably will occur with conventional communication circuitry. If this condition is not met, then there is no need to enter an emergency mode. First determining circuitry C16 performs this determination.

Threshold voltage Vthreshold may be an analog voltage from a constant voltage source (such as 3.2 volts), or may be an analog voltage created based upon input threshold voltage Vthreshhold[5:0] described below. Alternatively, battery voltage Vbat may be converted into a digital value, and this digital value may be digitally compared with input threshold Vthreshhold[5:0]. There are multiple feasible ways to perform this comparison and determination of whether this first condition is satisfied.

Second condition, determine that input minimum battery voltage Vbatampmin[5:0] is less than input threshold voltage Vthreshhold[5:0], and then set intermediate result Vbatampminlow[0] to 1 (enabled). This indicates that Vbatampmin[5:0] is relatively low, probably due to ET or APT attempts to conserve energy, and conventionally Vbatamp will be too low for bias circuitry BIAS2 to use operate properly (unless emergency actions are taken). Second determining circuitry C18 performs this determination.

In this figure, input threshold voltage Vthreshold[5:0] is an input value that may be externally changed (perhaps based on ambient temperature). However, this value may be fixed (e.g., digitally hardwired to 3.2 volts) to simplify the logic circuitry.

If the first condition and the second condition are satisfied, then bias circuitry cannot avoid problems merely by switching from Vbat to Vbatamp. Emergency steps must be taken to increase Vbatamp, despite external commands from Vbatampmin[5:0] to reduce Vbatamp in order to conserve power for ET or APT purposes.

The next two conditions (third and fourth conditions) are optional enabling conditions. One or both of these conditions may be permanently enabled (or simply ignored), although that would reduce control.

Third condition, receive threshold enabler enable_vbam3v2[0] having a value of "1" (enabled). This enable bit enables the possibility of overriding Vbatampmin [5:0] at multiplexer MUX4. This enable bit provides a dedicated external control for disabling the emergency mode without disabling any other features of power management circuitry CKT8. Alternatively, a value of 0 (or low voltage), may be defined as enabled, although generally high voltages are used to enable.

Fourth condition, automode is enabled by receiving enable automode input en_uBBbautomode[0]=1 (enabled). This enable bit enables the automode operation of pump PUMP2 as discussed in FIG. 4. Alternatively, a value of 0 (or low voltage), may be defined as enabled, although generally high voltages are used to enable.

Alternatively, automode may be permanently enabled, so that this enabling bit is moot, and this condition does not have to be checked.

Alternatively, threshold enabler enable_vbam3v2[0]=1 (enabled) may be simultaneously used to set the pump mode to the maximum mode (or a very high mode), so that pump PUMP2 creates the greatest voltage VuBB that it can create. This is not very efficient from a power point of view, but it allows an emergency mode to be implemented in a boost/buck circuit that lacks an automode, and it allows an emergency mode that bypasses (or overrides) an automode that is not enabled.

If all four conditions are satisfied, then AND gate AND2 receives four enabled (or satisfied) inputs, and then an emergency is declared by generating emergency condition indictor select[0]=1 (enabled). AND gate AND2 may be described as an emergency declarer.

During the declared emergency, second multiplexer MUX4 selects input threshold Vthreshold[5:0], and then sends the value of Vthreshold[5:0] as internal digital input RFFE_REGxx[5:0] to digital/analog converter DAC2. This effectively overrides input minimum battery voltage Vbatampmin[5:0], and seizes emergency control of digital/analog converter DAC2 (and of Vbatampmin, VuBB, and Vbatamp). This is why the emergency conditions prevent conventional (or peacetime) operations such as ET and APT. MUX4 may be described as an emergency selector.

During the declared emergency, Vbatampmin is the analog equivalent of Vthreshold[5:0]. Vbatampmin is sent to minimum mode circuitry CKT24 as described above regarding FIG. 3, and used to generate a corresponding VuBB (and Vbatamp). Vbatamp is sent to bias control BIAS2 as described above regarding FIG. 2.

In non-emergency conditions, second multiplexer MUX4 selects input minimum battery voltage Vbatampmin[5:0], and then sends the value of Vbatampmin[5:0] as internal digital input RFFE_REGxx[5:0] to digital/analog converter DAC2. Digital/analog converter DAC2 generates Vbatampmin, which generates VuBB, which becomes Vbatamp after filtering. In non-emergency conditions, Vbatamp may be reduced to low values during ET or APT by lowering Vbatampin[5:0].

Emergency conditions return to non-emergency conditions the moment that any of the four conditions is not satisfied. In particular, if the battery voltage Vbat increases to at least Vthreshold, then the first condition is not satisfied, and then the declared emergency is ended. After emergency control is released, ET or APT may reduce Vbatamp to low values to conserve power by inputting a low Vbatampin[5:0].

Figure 6:
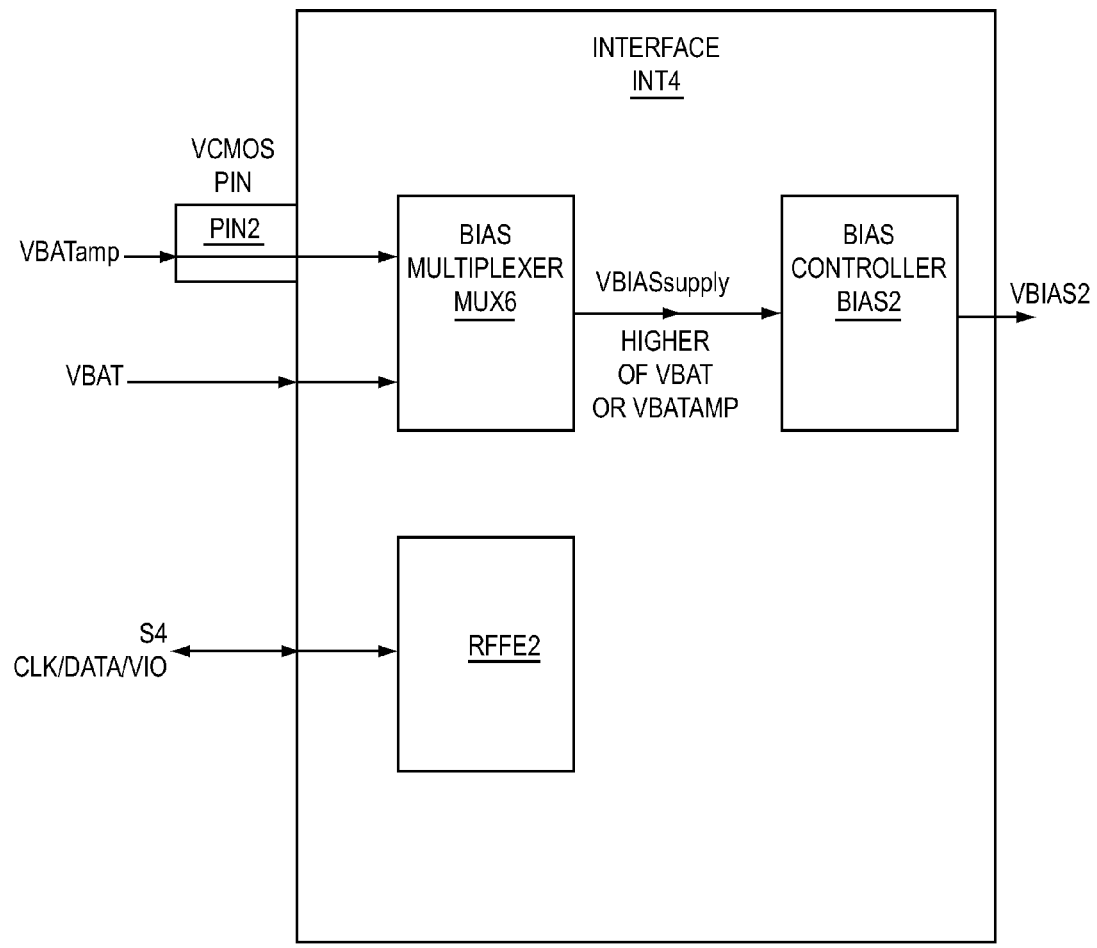
FIG. 6 illustrates a power interface in the power amplifier circuitry.

FIG. 6 illustrates power interface circuitry INT4 from power amplifier circuitry CKT10. Power interface circuitry INT4 includes bias multiplexer MUX6, bias controller BIAS2, and front end circuitry RFFE2.

Bias multiplexer MUX6 receives amplified battery voltage Vbatamp and battery voltage Vbat, then selects the higher voltage as bias supply voltage Vbiassupply. In a first case, bias multiplexer MUX6 may make this selection by itself.

Alternatively, in a second case, bias multiplexer MUX6 may use emergency selector Select[0] to select Vbatamp (instead of Vbat) when an emergency is declared, similar to the fashion that bias multiplexer MUX4 in logic circuitry LOGIC2 uses the emergency selector Select[0]. This second case would reduce the amount of logic needed by power interface INT4, but would require that the emergency selector Select[0] be communicated from power management circuitry CKT8 to power amplifier circuitry CKT10.

Bias controller BIAS2 receives Vbiassupply and then generates at least one bias voltage Vbias2 for at least one power amplifier such as P2. Under emergency conditions, Vbatamp remains above a threshold voltage, and bias multiplexer MUX6 selects Vbatamp as bias supply voltage Vbiassupply for bias controller BIAS2. Thus, under emergency conditions bias controller BIAS2 receives a bias supply voltage Vbiassupply that is higher than battery voltage Vbat, is at least as high as threshold voltage Vthreshold, and is sufficiently high to properly generate bias voltage Vbias2 for at least one power amplifier.

Power front end circuitry RFFE2 receives front end signals S4 such as a clock signal, serial data signals, and a dedicated voltage.

Figure 7:
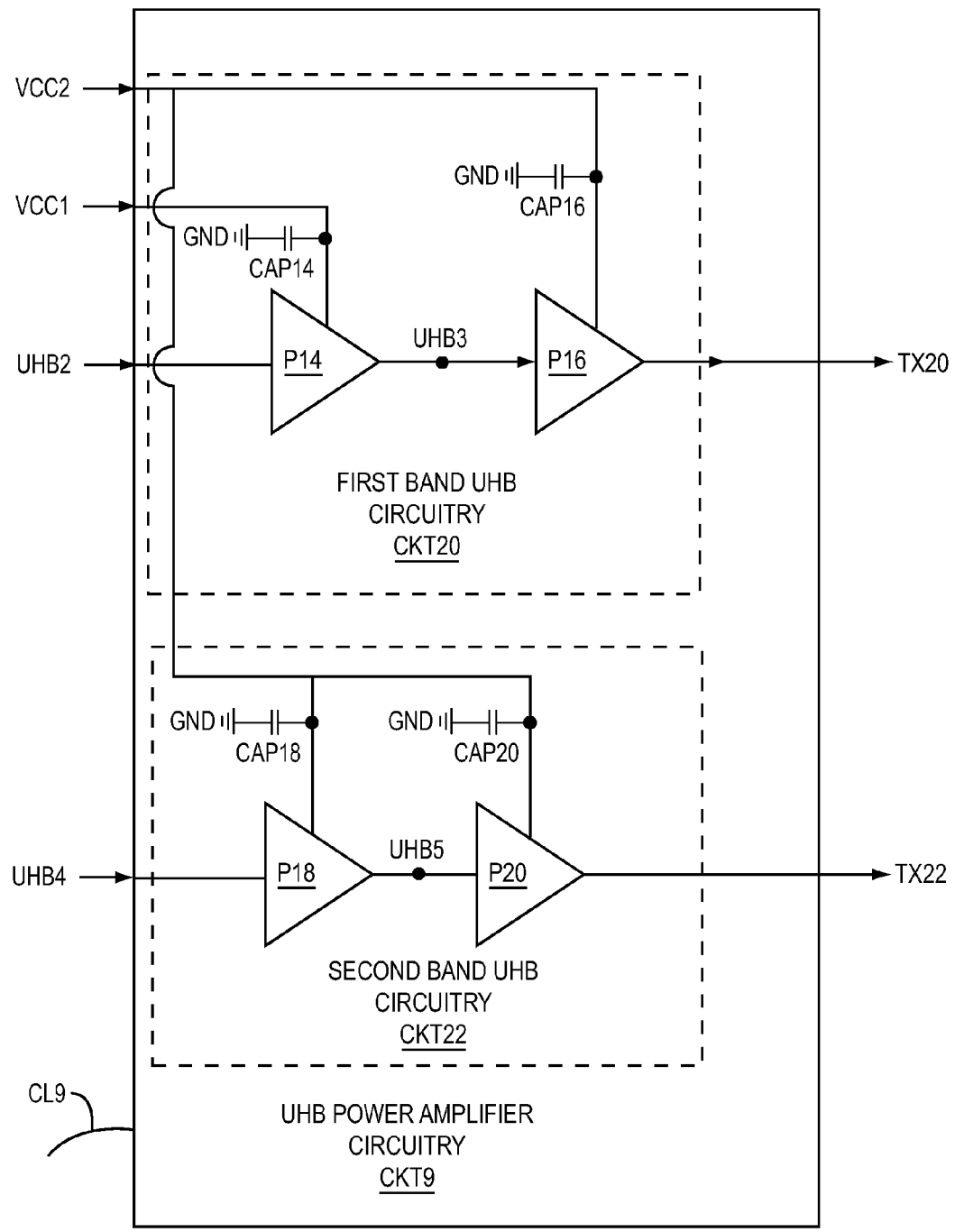
FIG. 7 illustrates UHB power amplifier circuitry.

FIG. 7 illustrates ultrahigh band (UHB) power amplifier circuitry CKT9 including first band UHB circuitry CKT20 and second band UHB circuitry CKT22, and receiving control lines CL9.

First band UHB circuitry CKT20 includes two power amplifiers in series. Power amplifier P14 receives signal UHB2 and uses supply voltage VCC1 to generate amplified signal UHB3. Power amplifier P16 receives amplified signal UHB3 and uses supply voltage VCC2 to generate further amplified signal TX20. Power supply voltage VCC1 is grounded through capacitor CAP14. Power supply voltage VCC2 is grounded through capacitor CAP16.

Second band UHB circuitry CKT22 includes two power amplifiers in series. Power amplifier P18 receives signal UHB4 and uses supply voltage VCC2 to generate amplified signal UHB5. Power amplifier P20 receives amplified signal UHB5 and uses supply voltage VCC2 to generate further amplified signal TX22. Power supply VCC2 is grounded through capacitor CAP18 and is grounded through capacitor CAP20. Alternatively, power amplifier P18 may use supply voltage VCC1, similar to power amplifier P14.

UHB power amplifier circuitry CKT9 may include an interface (not shown) similar to power interface INT4 from power amplifier circuitry CKT10.

Figure 8:
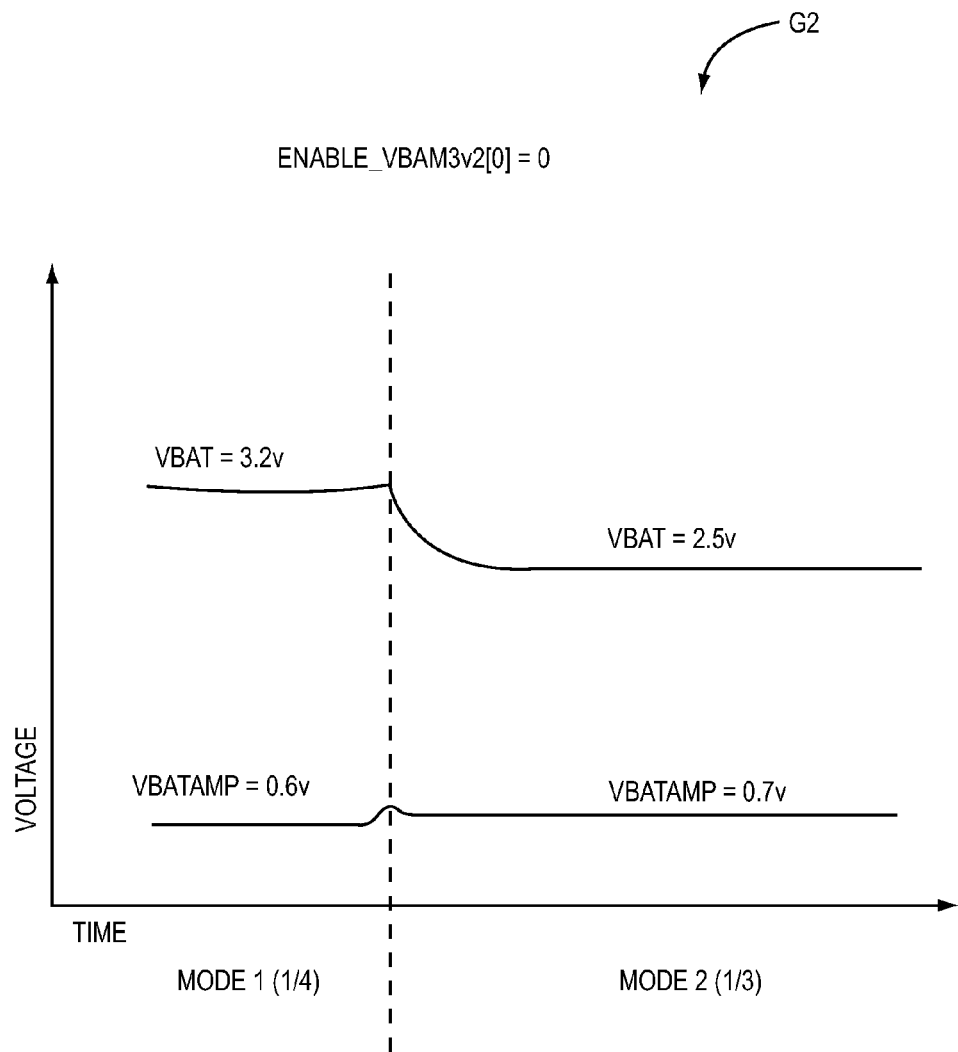
FIG. 8 illustrates power management circuitry responding to a drop in battery voltage when a set of emergency conditions is not satisfied.

FIG. 8 illustrates power management circuitry CKT8 responding to a drop in battery voltage when at least one condition is not satisfied (threshold enabler enable_vbam3v2 [0] is not enabled). At the dashed vertical line, battery voltage Vbat drops below a threshold voltage of 3.2 volts, and continues dropping down to 2.5 volts.

Amplified battery voltage Vbatamp begins at 0.6 volts (due to ET or APT), and remains very low, rising only to 0.7 volts. This slight rise from 0.6 volts to 0.7 volts occurs because the drop in battery voltage triggers a change in the mode of pump PUMP2 (from mode ¼ to mode ⅓) to maintain a Vbatamp at least equal to input minimum battery voltage Vbatampmin[5: 0].

This change in mode may be caused by an automode as discussed above (if en_uBBautomode[0] is enabled), or may be changed based on external calculations. In either case, 0.7 volts is not sufficient to serve as a supply for bias circuitry BIAS2.

Figure 9:
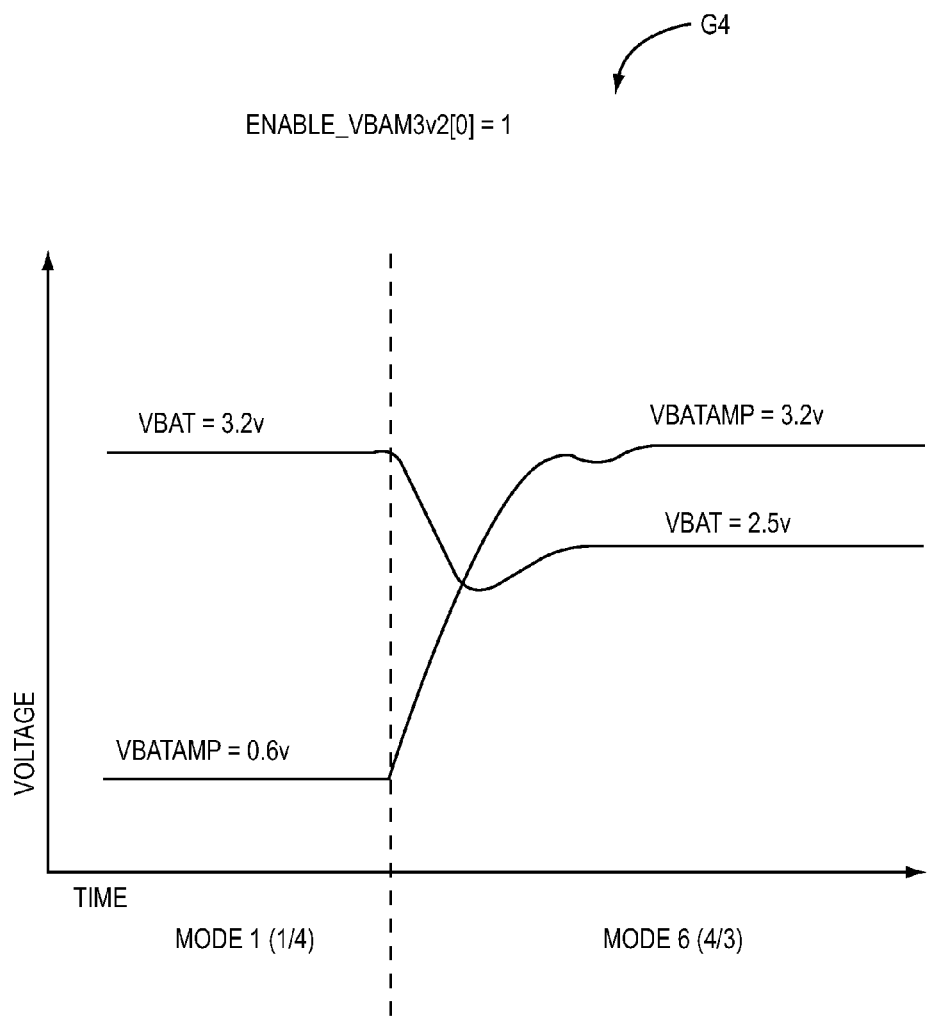
FIG. 9 illustrates power management circuitry responding to a drop in battery voltage when a set of emergency conditions is satisfied.

FIG. 9 illustrates power management circuitry CKT8 responding to a drop in battery voltage Vbat when a set of emergency conditions is satisfied. Referring back to logic circuitry LOGIC2 in FIG. 5, all emergency conditions are satisfied at the dashed line, and Vbatamp is driven to at least a threshold voltage Vthreshold of 3.2 volts. Thus, in a declared emergency Vbatamp is sufficient to serve as a supply for bias circuitry BIAS2.

Vbatamp is driven high by changing the mode of pump PUMP2 from mode ¼ to mode 4/3, as described above with respect to FIGS. 4, 5, and 6. This change in mode may be triggered by an automode as discussed above (en_uBBautomode[0] is enabled), or may be changed based on external calculations.

A table describing voltages and signals is provided below:

TABLE 1

LIST OF VARIABLES

| | |
|---|---|
| Vbat | battery voltage |
| VuBB | boost/buck voltage |
| Vbatamp | amplified battery voltage (VuBB after filtering) |
| uBB_mode[3:1] | input mode selector |
| uBB_freq[3:1] | input frequency selector |
| en_uBBautomode[0] | automode enabler |
| Vbatampmin[5:0] | input minimum battery voltage |
| enable_vbam3v2[0] | threshold enabler |
| Vthreshhold[5:0] | input threshold voltage |
| RFFE_REGxx[5:0] | internal minimum battery voltage |
| Vbatampminlow[0] | low input minimum battery voltage indicator |
| Vbatlow[0] | low battery voltage indicator |
| Select[0] | emergency selector |
| Vbatampmin | analog internal minimum battery voltage |
| uBB_mode[2:0] | internal minimum mode |

What is claimed is:

1. Power management circuitry comprising:
   power converter circuitry configured to receive a battery voltage and provide a converted supply voltage for biasing radio frequency (RF) power amplifier (PA) circuitry;
   logic circuitry coupled to the power converter circuitry and configured to:
      determine whether a condition is satisfied, the condition comprising that the battery voltage is below a minimum battery voltage threshold;
      if the condition is satisfied, cause the power converter circuitry to provide the converted supply voltage as a constant voltage; and
      if the condition is not satisfied, cause the power converter circuitry to provide the converted supply voltage such that the RF PA circuitry operates in one of an envelope tracking mode and an average power tracking mode.

2. The power management circuitry of claim 1 wherein the constant voltage is above the minimum battery voltage threshold.

3. The power management circuitry of claim 2 wherein the minimum battery voltage threshold is 3.2V.

4. The power management circuitry of claim 1 wherein the power converter circuitry is configured to provide the converted supply voltage such that the converted supply voltage is above a minimum supply voltage setting.

5. The power management circuitry of claim 4 wherein the condition further comprises that the minimum supply voltage setting is below a minimum supply voltage threshold.

6. The power management circuitry of claim 5 wherein the power converter circuitry is a buck-boost converter.

7. The power management circuitry of claim 6 wherein the power converter circuitry is configured to automatically choose a buck/boost ratio based on the battery voltage and the minimum supply voltage setting when an automode setting is enabled.

8. The power management circuitry of claim 7 wherein the condition further comprises that the automode setting is enabled.

9. Communication circuitry comprising:
radio frequency (RF) power amplifier (PA) circuitry configured to receive and amplify RF signals based at least in part on a converted supply voltage; and
power management circuitry coupled to the RF PA circuitry and configured to:
determine whether a condition is satisfied, the condition comprising that a battery voltage is below a minimum battery voltage threshold;
if the condition is satisfied, provide the converted supply voltage as a constant voltage; and
if the condition is not satisfied, provide the converted supply voltage such that the RF PA circuitry operates in one of an envelope tracking mode and an average power tracking mode.

10. The communication circuitry of claim 9 wherein the constant voltage is above the minimum battery voltage threshold.

11. The communication circuitry of claim 10 wherein the minimum battery voltage threshold is 3.2V.

12. The communication circuitry of claim 9 wherein the power management circuitry further comprises power converter circuitry configured to receive the battery voltage and provide the converted supply voltage.

13. The communication circuitry of claim 12 wherein the power converter circuitry is configured to provide the converted supply voltage such that the converted supply voltage is above a minimum supply voltage setting.

14. The communication circuitry of claim 13 wherein the condition further comprises that the minimum supply voltage setting is below a minimum supply voltage threshold.

15. The communication circuitry of claim 14 wherein the power converter circuitry is a buck-boost converter.

16. The communication circuitry of claim 15 wherein the power converter circuitry is configured to automatically choose a buck/boost ratio based on the battery voltage and the minimum supply voltage setting when an automode setting is enabled.

17. The communication circuitry of claim 16 wherein the condition further comprises that the automode setting is enabled.

* * * * *